US 6,714,345 B2

(12) United States Patent
Traynor

(10) Patent No.: US 6,714,345 B2
(45) Date of Patent: Mar. 30, 2004

(54) SEMICONDUCTOR OPTICAL AMPLIFIER PROVIDING HIGH GAIN, HIGH POWER AND LOW NOISE FIGURE

(75) Inventor: Nicholas J. Traynor, Fontainbleau (FR)

(73) Assignee: Corning Incorporated, Corning, NY (US)

( * ) Notice: Subject to any disclaimer, the term of this patent is extended or adjusted under 35 U.S.C. 154(b) by 51 days.

(21) Appl. No.: 10/133,923

(22) Filed: Apr. 25, 2002

(65) Prior Publication Data

US 2002/0181082 A1 Dec. 5, 2002

(30) Foreign Application Priority Data

May 25, 2001 (EP) .............................. 01401375

(51) Int. Cl.$^7$ .............................. H01S 2/20; G02B 6/26; H01L 29/66
(52) U.S. Cl. .............................. 359/344; 372/43; 372/44
(58) Field of Search .............................. 359/344; 372/43, 372/44

(56) References Cited

U.S. PATENT DOCUMENTS

| | | | |
|---|---|---|---|
| 4,565,558 A | | 1/1986 | Keil et al. ........................ 65/1 |
| 4,736,164 A | * | 4/1988 | Henning ........................ 372/19 |
| 4,795,228 A | | 1/1989 | Schneider ........................ 350/96 |
| 4,947,134 A | * | 8/1990 | Olsson ........................ 359/344 |
| 4,952,017 A | * | 8/1990 | Henry et al. ........................ 372/19 |
| 5,039,199 A | | 8/1991 | Mollenauer et al. ........ 359/334 |
| 5,239,410 A | * | 8/1993 | Nishimura et al. ......... 359/344 |
| RE35,697 E | | 12/1997 | Grasso et al. ................... 385/24 |
| 5,796,521 A | | 8/1998 | Kahlert et al. .............. 359/344 |
| 5,872,650 A | | 2/1999 | Lee et al. .................... 359/341 |

FOREIGN PATENT DOCUMENTS

| | | |
|---|---|---|
| EP | 0314373 A2 | 3/1989 |
| EP | 0314373 * | 5/1989 |
| EP | 0476830 A2 | 8/1991 |

OTHER PUBLICATIONS

"Erbium–Doped Fiber Amplifier with 54 dB Gain and 3.1 dB Noise Figure" Laming, et al. IEEE Photonics Technology Letters, vol. 4, No. 12, Dec.1992.
"Broadband Operation Of InGaAsP–InGaAs Grin–SC–MQW BH Amplifiers with 115mW Output Power" Electronics Letters Apr. 12, 1990 Vo. 26, No. 8.
"Taper–waveguide integration for polarisation insensitive InP/InGaAsP based Optical Amplifiers" Bruckner, et al Electronics Letters Aug. 4, 1994 vol. 30, No. 16.

* cited by examiner

Primary Examiner—Nelson Moskowitz
(74) Attorney, Agent, or Firm—Juliana Agon

(57) ABSTRACT

An optical signal amplifier includes a first semiconductor optical amplifier having an input for receiving an optical signal, and an output, wherein the optical signal is amplified by the first semiconductor optical amplifier resulting in an amplified optical signal. The optical amplifier also includes an optical signal isolator having an input in optical communication with the output of the first semiconductor optical amplifier, and an output, wherein the optical signal isolator receives the amplified signal from the first semiconductor optical amplifier and allows for transmission of an optical signal in a single direction. The optical amplifier further includes a second semiconductor optical amplifier having an input for receiving the amplified optical signal from the optical signal isolator, and an output, wherein the amplified optical signal is amplified by the second semiconductor optical amplifier resulting in a twice amplified optical signal.

31 Claims, 2 Drawing Sheets

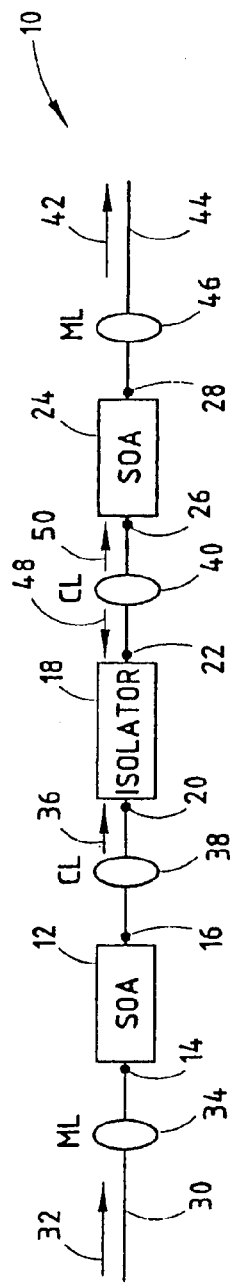
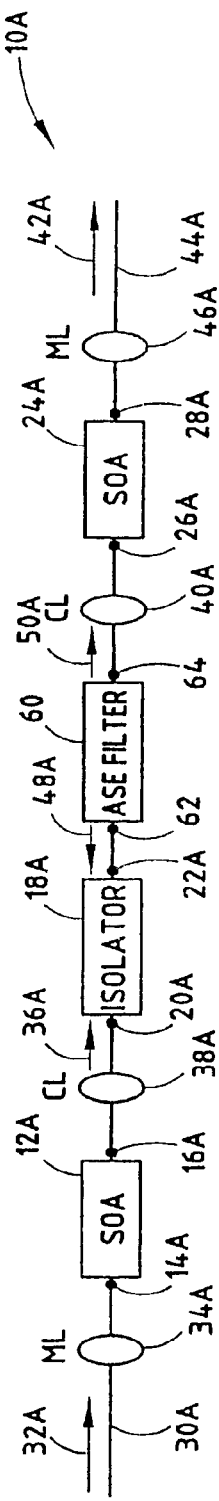
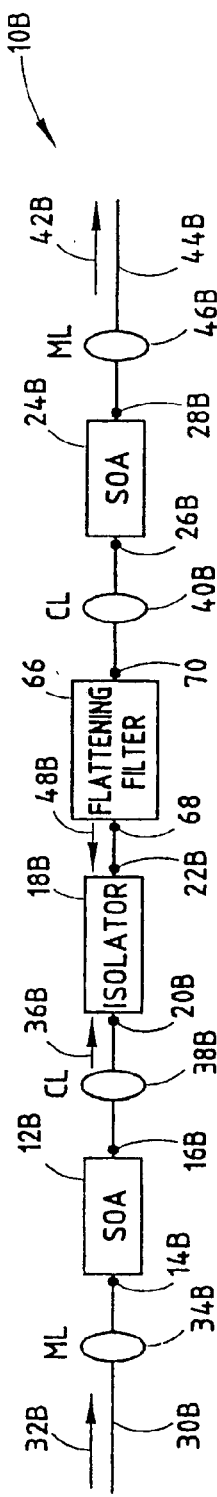

SEMICONDUCTOR OPTICAL AMPLIFIER PROVIDING HIGH GAIN, HIGH POWER AND LOW NOISE FIGURE

CLAIM OF PRIORITY

The application claims the benefit priority of European Application number 01401375.9 filed May 25, 2001.

BACKGROUND OF THE INVENTION

1. Field of the Invention

The invention is directed to an optical amplifier, and in particular, to an optical amplifier that includes at least two semiconductor optical amplifiers and an optical signal isolator.

2. Technical Background

The continuous growth of bandwidth requirements in optical-based communication systems has resulted in a large demand for systems able to operate outside the amplification band provided by erbium-doped fiber amplifiers. Erbium-doped fiber amplifiers effectively operate over a limited wavelength band. Depending on amplifier configuration and fiber composition, erbium-doped fiber can be used for amplification in a wavelength band extending from 1530 nm to 1620 nm, although at least three different erbium-doped fiber amplification configurations would be required to cover this entire range.

Other rare earth-doped fiber amplifiers have been used for amplification outside the erbium wavelength and from 1530 nm to 1620 nm. These other rare earth-doped amplifiers include thulium-doped amplifiers operating from 1440 nm to 1510 µm, praseodymium-doped amplifiers operating from 1250 nm to 1310 nm, and neodymium-doped amplifiers operating from 1310 nm to 1350 µm. Each of these rare earth-doped amplifiers exhibit very low efficiency as well as other technical problems associated with each particular kind of dopant when compared to erbium-doped amplifiers.

Rare earth-doped amplification systems cover the available transmission window of traditional silica fiber. However, this transmission window has been expanded with the development of new fibers. In many new fibers, where the OH absorption around 1400 nm has been greatly reduced, there is a potential for optical amplifier configurations which can amplify between an entire optical operating range of from 1100 nm to 1700 nm.

One particular amplifier configuration that has been used to amplify wavelength band ranges greater than can be amplified with singular rare earth-doped amplifiers is the semiconductor optical amplifier. A semiconductor optical amplifier can provide gain over the entire operating transmission window of 1100 nm to 1700 µm. For example, semiconductor optical amplifier components based on the material composite of $Ga_xIn_{1-x}As_yP_{y-1}$ can provide gain within the range of 1000 nm to 1650 nm depending on the relative concentration of the constituent elements.

Optical amplification, including amplification affected by a semiconductor optical amplifier, relies on the known physical mechanisms of population inversion and stimulated emission. More specifically, amplification of an optical signal depends on the stimulated transmission of an optical medium from an inverted, excited state to a lower, less excited state. Prior to the actual amplification of the optical signal, a population inversion occurs, i.e., more upper excited states exist than lower states. This population inversion is affected by appropriately energizing the system. In semiconductor optical amplifiers, an excited state is a state in which there exists an electron in the conduction band and a concomitant hole in the valance band. A transition from such an excited state, to a lower state in which neither an electron nor a hole exists, results in the creation of a photon or a stimulated emission. The population inversion is depleted every time an optical signal passes through the amplifier and is amplified. The population inversion is then reestablished over some finite period of time. As a result, the gain of the amplifier will be reduced for some given period of time following the passage of any optical signal through the amplifier. This recovery of time, is typically denoted as the "gain-recovery time" of the amplifier.

In contrast to erbium-doped amplifiers, or other rare earth-doped amplifiers, semiconductor optical amplifiers are smaller, consume less power and can be formed in an array more easily. Accordingly, semiconductor optical amplifiers are important in applications such as loss compensation for optical switches used in multi-channel optical transmission systems or optical switchboard systems.

Two major drawbacks are associated with semiconductor optical amplifiers. The first drawback is that the noise figure associated with semiconductor optical amplifiers is significantly high. While all amplifiers degrade the signal-to-noise ratio of the amplified signal because of spontaneous emission that is added to the signal during amplification, the noise figure associated with semiconductor optical amplifiers is extremely problematic. The reason for this is two-fold. Firstly, low loss coupling from an optical fiber to a semiconductor optical amplifier is difficult due to the mode field mismatch between the devices. Specifically, coupling losses due to mode field mismatch are generally in the region of about 2 dB or more. The coupling loss generated from coupling an optical fiber with a semiconductor optical amplifier is directly added to the intrinsic (or internal) noise figure of the device. Secondly, increasing the gain in a semiconductor optical amplifier requires increasing the length of the device and/or the optical confinement factor. While increasing the length of the device and/or the optical confinement factor allows for high gain in the optical signal, this also results in high gain for the amplified spontaneous emission generated within the semiconductor optical amplifier. Above a certain device length, this amplified spontaneous emission will saturate the device, thereby limiting the achievable gain. Equally important, the backward traveling amplified spontaneous emission results in a reduction in the carrier density at the input of the device, thereby leading to a low inversion ratio within that device. As with any kind of optical amplifier, a low inversion ratio at the input of the amplifier results in an increased noise figure. In the past, the best achievable intrinsic noise figure for semiconductor optical amplifiers is around 4 dB for devices based on multiple quantum well structures, and around 5 dB for devices based on bulk guiding structures.

A second problem associated with semiconductor optical amplifiers is signal cross-talk resulting from cross-gain modulation. Signal cross-talk arises because the saturation output power of the semiconductor optical amplifier is lower than that of the fiber based amplifiers, and because the gain recovery time is on the same time scale as the data repetition rate. Thus, a semiconductor optical amplifier amplifying multiple signals with a combined input power greater than the input saturation power will superimpose cross-talk caused by gain modulation between the relative channels.

SUMMARY OF THE INVENTION

This invention meets the need for an optical amplifier that offers the benefit of a relatively large gain and optical signal strength together with a substantially low noise figure.

The invention relates to an optical signal amplifier that includes two semiconductor optical amplifiers separated by an optical signal isolator. More specifically, the present inventive optical amplifier makes use of the significant gain typically associated with semiconductor optical amplifiers while reducing the significant noise figure typically associated with semiconductor optical amplifiers.

In a preferred embodiment, an optical amplifier includes a first semiconductor optical amplifier having an input for receiving an optical signal, and an output, wherein the optical signal is amplified by the first semiconductor optical amplifier resulting in a first amplified optical-signal. The optical signal amplifier also includes an optical signal isolator having input in optical communication with the output of the first semiconductor optical amplifier, and an output, wherein the optical signal isolator receives the amplified signal from the first semiconductor optical amplifier and allows for transmission of an optical signal in a single direction. The optical signal amplifier further includes a second semiconductor optical amplifier having an input for receiving the amplified optical signal from the optical signal isolator, and an output, wherein the amplified optical signal is amplified by the second semiconductor optical amplifier resulting in a second twice amplified optical signal.

In addition, embodiments of the optical signal amplifier include an amplified spontaneous emissions filter located within the optical signal amplifier so as to prevent amplified spontaneous emissions lying outside the used gain band from propagating forward to the second semiconductor optical amplifier.

Further, embodiments of the optical signal amplifier include a gain flattening filter positioned within the optical signal amplifier and located between the first semiconductor optical amplifier and the second semiconductor optical amplifier to produce a flattened gain over a desired spectral range.

Other embodiments include an optical communications system that utilizes the optical signal amplifier, as well as a method for utilization of the inventive optical signal amplifier.

It is to be understood that the foregoing description is exemplary of the invention only and is intended to provide an overview for the understanding of the nature and character of the invention as it is defined in the claims. The accompanying drawings are included to provide a further understanding of the invention and are incorporated and constitute part of the specification. The drawings illustrate various features and embodiments of the invention which, together with their description, serve to explain the principles and operation of the invention.

BRIEF DESCRIPTION OF THE DRAWINGS

FIG. 1 is a schematic view of an optical signal amplifier embodying the present invention, including a first semiconductor optical amplifier, a second semiconductor optical amplifier, and an optical signal isolator;

FIG. 2 is a schematic view of the composite optical amplifier, including an amplified spontaneous emissions filter;

FIG. 3 is a schematic view of the optical signal amplifier, including a gain flattening filter;

DETAILED DESCRIPTION OF THE PREFERRED EMBODIMENTS

Figure 4:
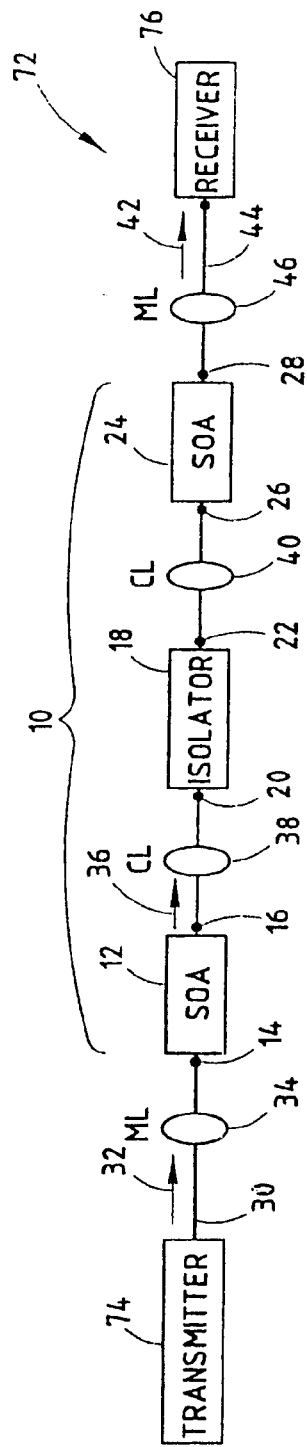
FIG. 4 is a schematic view of a fiber optic communications system employing an optical signal amplifier of the present invention.

Additional features and advantages of the invention will be set forth in the detailed description which follows and will be apparent to those skilled in the art from the description or recognized by practicing the invention as described in the description which follows together with the claims and appended drawings.

It is to be understood that the foregoing description is exemplary of the invention only and is intended to provide an overview of the understanding of the nature and character of the invention as it is defined in the claims. The accompanying drawings are included to provide a further understanding of the invention and are incorporated and constitute part of the specification. The drawings illustrate various features and embodiments of the invention which, together with their description, serve to explain the principles and operation of the invention.

Definitions

The following terminology and definitions are commonly used in the art.

The noise figure of a two stage amplifier is defined as, $$NF_{tot} = NF_1 + \frac{NF_2 - 1}{G_1},$$

wherein $NF_{tot}$ is the total noise figure of the composite amplifier, $NF_1$ and $NF_2$ are the individual noise figures of the first and second stage amplifiers, respectively, and $G_1$ is the gain of the first stage of the amplifier.

The mechanism for improving the saturation output power of the semiconductor optical amplifier is defined as, $$\frac{dI^{(s)}}{dz} = \Gamma A^{(s)} \frac{\Gamma J/ed + (\Gamma A^{(p)}/h\nu) N_a^{(p)} I^{(p)} - N_a^{(s)}}{1 + I^{(s)}/I_o^{(s)}} I^{(s)},$$

where $$\frac{1}{\Gamma} = \frac{1}{\Gamma_c} + \frac{A^{(p)} I^{(p)}}{h\nu}, \quad I_o^{(s)} = \frac{h\nu}{\Gamma A^{(s)}} = \frac{h\nu}{A^{(s)}} \left( \frac{1}{\Gamma_c} + \frac{A^{(p)} I^{(p)}}{h\nu} \right),$$

and where $I^{(i)}$ is the pumping light intensity, $\Gamma$ is the confinement factor, $A^{(i)}$ is the differential gain coefficient, N is the carrier density, $N_a^{(i)}$ is the carrier density in a transparent condition, hv is the a photon energy, $\Gamma_c$ is the carrier lifetime, J is the injection current, e is the electronic change, d is the waveguide thickness, and superscripts p and s denote pump and signal lights, respectively. $I^{(s)}/I_o^{(s)}$ indicates the degree of gain saturation and is inversely proportional to $I_o^{(s)}$, which is larger with pumping light than without pumping light. Injecting a pumping light in the semiconductor optical amplifier makes $I_o^{(s)}$ larger, which results in an improved saturation characteristic of the semiconductor optical amplifier.

Controlling the carrier density effects the unsaturated gain of the semiconductor optical amplifier by, $$(\Gamma A^{(p)}/h\nu) N_a^{(p)} I^{(p)} = \frac{\Gamma N_a^{(p)} A^{(p)} I^{(p)}}{h\nu + \Gamma_c A^{(p)} I^{(p)}},$$

where choosing the proper pumping light wavelength can be used to control the unsaturated gain.

An optical signal amplifier 10 (FIG. 1) includes a first semiconductor optical amplifier 12 having an input 14 for receiving an optical signal, and an output 16. The optical signal is amplified by first semiconductor optical amplifier 12 resulting in a first amplified optical signal. The optical signal amplifier 10 also includes an optical signal isolator 18 coupled in series with amplifier 12 and having an input signal 20 in optical communication with output 16 of first semiconductor optical amplifier 12, and an output 22. The optical signal isolator 18 receives the amplified signal from first semiconductor optical amplifier 12 and permits transmission of an optical signal lying within a particular operating wavelength range, to propagate in a single direction. The optical signal amplifier 10 further includes a second semiconductor amplifier 24 coupled in series with amplifier 12 and isolator 18 and having an input 26 for receiving the amplified optical signal from optical signal isolator 18, and an output 28. The amplified optical signal is amplified by second semiconductor amplifier 24 resulting in a second twice amplified optical signal.

In the illustrated example, optical signal amplifier 10 is a two-stage optical amplifier, wherein the first stage is represented by first semiconductor optical amplifier 12 and the second stage is represented by second semiconductor optical amplifier 24. An input waveguide optical fiber 30 guides the optical signal traveling in a direction indicted by arrow 32 to input 14 of first semiconductor optical amplifier 12. The waveguide optical fiber 30 is optically coupled to input 14 of first semiconductor optical amplifier 12 via an optical coupling device such as a micro-lens 34. Alternatively, micro-lens 34 may be replaced by providing input 14 of first semiconductor optical amplifier 12 with an integrated mode field taper, thereby allowing direct connection of waveguide optical fiber 30 with input 14 of first semiconductor optical amplifier 12. Only a modest gain is required from first semiconductor optical amplifier 12 because the amplified signal traveling in a direction indicated by arrow 36 is later re-amplified by second semiconductor optical amplifier 24.

The amplified signal 36 is guided from output 16 of first semiconductor optical amplifier 12 to input 20 of optical signal isolator 18. Output 16 of first semiconductor optical amplifier 12 is optically coupled with input 20 of optical signal isolator 18 via an optical coupling lens 38. Subsequent to traveling through optical signal isolator 18, amplified signal 36 travels from output 22 of optical signal isolator 18 to input 26 of second semiconductor optical amplifier 24. Output 22 of optical signal isolator 18 is optically coupled with input 26 of second semiconductor optical amplifier 24 via a second optical coupling lens 40.

The second semiconductor optical amplifier 24 amplifies amplified signal 36, resulting in a twice amplified signal traveling in a direction indicated by arrow 42 within a second waveguide optical fiber 44. In the illustrated example, a second optical micro-lens 46 optically couples output 28 of second semiconductor optical amplifier 24 with second waveguide optical fiber 44. Alternatively, micro-lens 46 may be replaced by providing output 28 of second semiconductor optical amplifier 24 with an integrated mode field taper, thereby allowing direct connection of waveguide optical fiber 44 with output 28 of second semiconductor optical amplifier 24.

The second semiconductor optical amplifier 24 generates a backwards traveling amplified spontaneous emissions traveling in a direction indicated by arrow 48. The amplified spontaneous emissions 48 would result in a reduction to the carrier density at input 14 of first semiconductor optical amplifier 12 and hence cause an increase in the noise figure with respect to an unsaturated device, if allowed to propagate to input 14 of first semiconductor amplifier 12. The optical signal isolator 18 prevents the amplified spontaneous emissions 48 generated within second semiconductor optical amplifier 24 from reaching input 14 of first semiconductor optical amplifier 12, thereby minimizing the noise figure of the first stage, and as a result, the noise figure of optical signal amplifier 10. The optical signal isolator 18 does not prevent forward traveling amplified spontaneous emissions traveling in a direction indicated by arrow 50, from reaching input 26 of second semiconductor optical amplifier 24.

Figure 5:
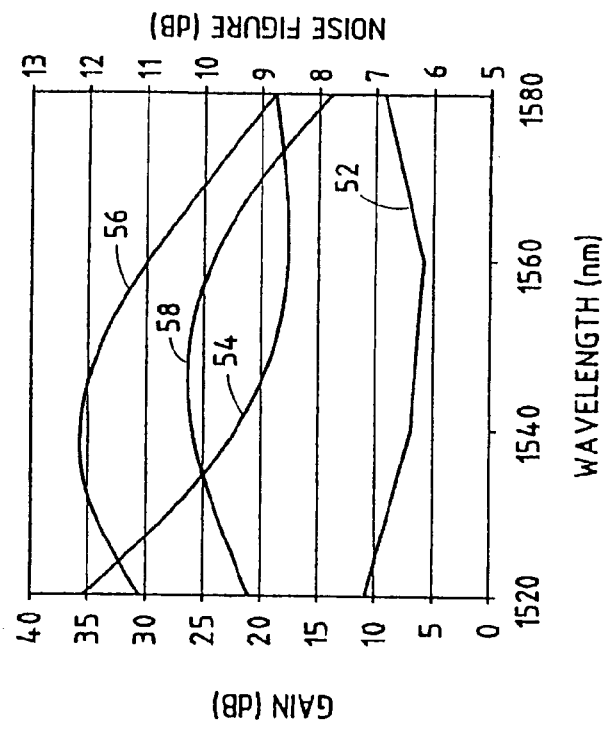
FIG. 5 is a graph of gain and noise figures versus wavelength for the optical signal amplifier of the present invention and a single-stage optical signal amplifier providing comparable gain.

The optical signal amplifier 10 then provides a significantly reduced noise figure than that associated with a single stage device providing the entire gain range by itself. As illustrated in FIG. 5, the noise figure of optical signal amplifier 10 is greater than 2 dB less than a similar single stage device which provides a similar amount of gain. Specifically, curve 52 indicates the noise figure as provided by the two-stage optical signal amplifier 10, and is significantly reduced from the noise figure provided by a comparable single stage semiconductor optical amplifier as indicated by curve 54. In addition, the overall gain provided by optical signal amplifier 10 is enhanced due to the fact that optical signal isolator 18 prohibits backward propagating amplified spontaneous emissions 48 from reaching input 14 of first semiconductor optical amplifier 12 which, in turn, would limit the overall gain of the device. Specifically, the overall gain provided by the two-stage optical signal amplifier 10, as indicated by curve 56, is greater than the overall gain provided by a comparable single-stage semiconductor optical amplifier, the gain of which is indicated by curve 58.

In addition, if the confinement factor of second semiconductor optical amplifier 24 is kept low, approximately between 1% and 2%, first semiconductor optical amplifier 12 achieves most of the gain provided by optical signal amplifier 10, while second semiconductor optical amplifier 24 provides a low gain but high output power. Output powers as great as 115 mW have been achieved with the optical signal amplifier 10 of FIG. 1.

Another embodiment of an optical signal amplifier 10A is show in FIG. 2. Amplifier 10A is similar to the previously described optical signal amplifier 10, similar parts appearing in FIG. 1 and FIG. 2, respectively, are represented by the same, corresponding reference numeral, except for the suffix "A" in the numerals of the latter. The optical signal amplifier 10A includes an amplified spontaneous emissions filter 60 in series between isolator 18A and amplifier 24A. Filter 60 has an input 62 for receiving amplified signal 36A, and an output 64. The input 62 of amplified spontaneous emissions filter 60 is in optical communication with output 22A of optical signal isolator 18A. In operation, the amplified spontaneous emissions filter 60 blocks the rearwardly propagating amplified spontaneous emissions 48A as generated by second semiconductor optical amplifier 12A. The amplified spontaneous emissions filter 60 prevents the forwardly propagating amplified spontaneous emissions 50A generated by first semiconductor optical amplifier 12A from propagating to input 26A of second semiconductor optical amplifier 24A, thereby reducing the extent of saturation of second semiconductor optical amplifier 24A by the amplified spontaneous emissions 50A and allowing for greater signal gain within second semiconductor optical amplifier 24A.

In another embodiment of the invention, an optical signal amplifier 10B is shown in FIG. 3. Since optical signal amplifier 10B is similar to the previously described optical signal amplifier 10, similar parts appearing in FIG. 1 and FIG. 3 respectively, are represented by the same, corresponding reference numeral, except for the suffix "B" in the numerals of the latter. The optical signal amplifier 10B includes a gain flattening filter 66 coupled in series between isolator 18B and amplifier 24B. Filter 66 has an input 68 for receiving amplified signal 36B and an output 70. Input 68 of gain flattening filter 66 is in optical communication with output 22B of optical signal isolator 18B, while the output 70 of gain flattening filter 66 is in optical communication with input 26B of second semiconductor optical amplifier 24B. In operation, gain flattening filter 66 flattens the gain over a desired a spectral range as provided by first semiconductor optical amplifier 12B, resulting in a flattened gain over the desired spectral range within twice amplified signal 42B. It should be noted that gain flattening filter 66 can be provided in the form of a thin film gain flattening filter, however, any gain flattening filter capable of flattening the gain over a desired spectral range as emitted from a semiconductor optical amplifier may be utilized. It should further be noted that amplified spontaneous emissions filter 60 (FIG. 2) and gain flattening filter 66 (FIG. 3) may both be utilized within optical signal amplifier 10.

As shown in FIG. 4, and in accordance with the present invention, an optical signal amplifier 10 (or 10A or 10B) is constructed and configured in accordance with one or more embodiments of the amplifiers of the present invention are used in an optical communications system 72. System 72 includes a transmitter 74 and a receiver 76, wherein transmitter 74 transmits an optical signal via optical fiber 30 to optical signal amplifier 10, which is in turn received by receiver 76 via optical fiber 44 after being amplified by optical signal amplifier 10. The system 72 may include multiple amplifiers along its length and one or more of each of the embodiments shown in FIGS. 1–3.

The optical signal amplifiers described herein are effective for amplifying optical signals through any wavelengths within the usable optical signal wavelength range. The optical signal amplifier utilizes the high gain typically associated with semiconductor optical amplifiers while reducing the noise association also associated therewith.

It will become apparent to those skilled in the art that various modifications to the preferred embodiment of the invention as described herein can be made without departing from the spirit or scope of the invention as defined by the appended claims.

The invention claimed is:

1. An optical amplifier, comprising:
a first semiconductor optical amplifier having a high gain and an input for receiving an optical signal, and an output, wherein the optical signal is amplified by the first semiconductor optical amplifier resulting in a first amplified optical signal having a high output power;
an optical signal isolator having an input in optical communication with the output of the first semiconductor optical amplifier, and an output, wherein the optical signal isolator receives the first amplified signal from the first semiconductor optical amplifier and transmits the first optical signal in a single direction; and
a second semiconductor optical amplifier having a low confinement factor approximately between 1% and 2% to provide a low gain less than the first semiconductor optical amplifier, the second semiconductor optical amplifier having an input for receiving the first amplified optical signal from the optical signal isolator, and an output, wherein the amplified optical signal is amplified by the second semiconductor optical amplifier with the low gain of the second semiconductor optical amplifier and The high output power from the first semiconductor optical amplifier resulting in a twice amplified optical signal.

2. The optical amplifier of claim 1, and including a first optical coupling lens coupling the output of the first semiconductor optical amplifier to the input of the optical signal isolator.

3. The optical amplifier of claim 2, and including a second optical coupling lens coupling the output of the optical signal isolator to the input of the second semiconductor optical amplifier.

4. The optical amplifier of claim 3, and including a first optical coupling lens coupling the input of the first semiconductor optical amplifier to a first optical waveguide fiber and wherein the first optical waveguide fiber delivers the optical signal to the input of the first semiconductor optical amplifier.

5. The optical amplifier of claim 4, and including a second optical coupling lens coupling the output of the second semiconductor optical amplifier to a second optical waveguide fiber, and wherein the second optical waveguide fiber delivers the twice amplified optical signal from the output of the second semiconductor optical amplifier.

6. The optical amplifier of claim 3, wherein the input of the first semiconductor optical amplifier includes an integrated mode field taper which is coupled with a first optical waveguide fiber, and wherein the first optical waveguide fiber delivers the optical signal to the input of the first semiconductor optical amplifier.

7. The optical amplifier of claim 6, wherein the output of the second semiconductor optical amplifier includes an integrated mode field taper which is coupled with a second optical waveguide, and wherein the second optical waveguide fiber delivers the twice amplified optical signal from the output of the second semiconductor optical amplifier.

8. The optical amplifier of claim 1, and including a first optical coupling lens coupling the input of the first semiconductor optical amplifier to a first optical waveguide fiber and wherein the first optical waveguide fiber delivers the optical signal to the input of the first semiconductor optical amplifier.

9. The optical amplifier of claim 8, and including a second optical coupling lens coupling the output of the second semiconductor optical amplifier to a second optical waveguide fiber and wherein the second optical waveguide fiber delivers the twice amplified optical signal from the output of the second semiconductor optical amplifier.

10. The optical amplifier of claim 1, wherein the input of the first semiconductor optical amplifier includes an integrated mode field taper which is coupled with a first optical waveguide fiber, and wherein the first optical waveguide fiber delivers the optical signal to the input of the first semiconductor optical amplifier.

11. The optical amplifier of claim 10, wherein the output of the second semiconductor optical amplifier includes an integrated mode field taper which is coupled with a second optical waveguide, and wherein the second optical waveguide fiber delivers the twice amplified optical signal from the output of the second semiconductor optical amplifier.

12. The optical amplifier of claim 1, further including:
an amplified spontaneous emissions filter having an input for receiving the amplified signal, and an output, wherein the input of the amplified spontaneous emissions filter is in optical communication with the output of the optical signal isolator; and
a gain flattening filter having an input for receiving the amplified signal, and an output, wherein the input of the gain flattening filter is in optical communication with the output of the amplified spontaneous emissions filter, and the output of the gain flattening filter is in optical communication with the input of the second semiconductor optical amplifier.

13. The optical amplifier of claim 1, further including:
an amplified spontaneous omissions filter having an input for receiving the amplified signal, and an output, wherein the input of the amplified spontaneous emissions filter is in optical communication with the output of the optical signal isolator, and the output of the spontaneous emissions filter is in optical communication with input of the second semiconductor optical amplifier.

14. The optical amplifier of claim 1, thither including:
a gain flattening filter having an input for receiving the amplified signal, and an output, wherein the input of the gain flattening filter is in optical communication with the output of the optical signal isolator, and the output of the gain flattening filter is in optical communication with the input of the second semiconductor optical amplifier.

15. A method for amplifying an optical signal, comprising:
providing a first semiconductor optical amplifier having a high gain and an input for receiving an optical signal, and an output;
conducting at least one optical signal through the first semiconductor optical amplifier;
amplifying the optical signal within the first semiconductor optical amplifier resulting in an amplified signal having a high output power;
providing an optical signal isolator having an input in optical communication with the output of the first semiconductor optical amplifier, and an output, the optical signal isolator allowing for transmission of an optical signal is a single direction;
conducting the amplified signal through the optical signal isolator;
providing a second semiconductor optical amplifier having low confinement factor approximately between 1% and 2% to provide a low gain less than the first semiconductor optical amplifier, the second semiconductor optical amplifier having an input for receiving the amplified optical signal from the optical signal isolator, and an output; and
additionally amplifying the amplified optical signal within the second semiconductor optical amplifier with the low gain of the second semiconductor optical amplifier and the high output power from the first semiconductor optical amplifier resulting in a twice amplified signal.

16. The method of claim 15, further including:
optically coupling the output of the first semiconductor optical amplifier with the input of the optical signal isolator via a first optical coupling lens.

17. The method of claim 16, further including:
optically coupling the output of the optical signal isolator with the input of the second semiconductor optical amplifier via a second optical coupling lens.

18. The method of claim 17, further including:
optically coupling the input of the first semiconductor optical amplifier with a first optical waveguide fiber via a first optical coupling lens; and
delivering the optical signal to the input of the first semiconductor optical amplifier via the first optical waveguide.

19. The method of claim 18, further including:
optically coupling the output of the second semiconductor optical amplifier with a second optical waveguide fiber via a second optical coupling lens; and
delivering the twice amplified optical signal to the second optical waveguide.

20. The method of claim 15, further including:
optically coupling the input of the first semiconductor optical amplifier with a first optical waveguide fiber via a first optical coupling lens; and
delivering the optical signal to the input of the first semiconductor optical amplifier via the first optical waveguide.

21. The method of claim 20, further including:
optically coupling the output of the second semiconductor optical amplifier with a second optical waveguide fiber via a second optical coupling lens; and
delivering the twice amplified optical signal to the second optical waveguide.

22. The method of claim 15, farther including:
providing an amplified spontaneous emissions filter having an input for receiving the amplified signal, and an output;
filtering amplified spontaneous emissions emitted from the second semiconductor optical amplifier with the amplified spontaneous emissions filter;
providing a gain flattening filter having an input for receiving the amplified signal, and an output; and
flattening the gain contained within the amplified optical signal by passing the amplified optical signal through the gain flattening filter.

23. The method of claim 15, further including:
providing an amplified spontaneous emissions filter having an input for receiving the amplified signal, and an output; and
filtering amplified spontaneous emissions emitted from the second semiconductor optical amplifier with the amplified spontaneous emissions filter.

24. The method of claim 15, farther including:
providing a gain flattening filter having an input for receiving the amplified signal, and an output; and
flattening the gain contained within the amplified optical signal by passing the amplified optical signal through the gain flattening filter.

25. An optical communications system, comprising:
an optical signal transmitter;
a first semiconductor optical amplifier having a high gain and an input for receiving an optical signal from the transmitter, and an output, wherein the optical signal is amplified by the first semiconductor optical amplifier resulting in an amplified optical signal having a high output power;
an optical signal isolator having an input in optical communication with the output of the first semiconductor optical amplifier, and an output, wherein the optical signal isolator receives the amplified signal from the first semiconductor optical amplifier and allows for transmission of an optical signal is a single direction;
a second semiconductor optical amplifier having a low confinement factor approximately between 1% and 2% to provide a low gain less than the first semiconductor optical amplifier, the second semiconductor optical amplifier having an input for receiving the amplified optical signal from the optical signal isolator, and an output, wherein the amplified optical signal is amplified by the second semiconductor optical amplifier with the low gain of the second semiconductor optical amplifier and the high output power from the first semiconductor optical amplifier resulting in a twice amplified optical signal; and an optical signal receiver for receiving the twice amplified signal.

26. The optical communications system of claim 25, further including:

an amplified spontaneous emissions filter having an input for receiving the amplified signal, and an output, wherein the input of the amplified spontaneous emissions filter is in optical communication with the output of the optical signal isolator; and a gain flattening filter having an input for receiving the amplified signal, and an output, wherein the input of the gain flattening filter is in optical communication with the output of the amplified spontaneous emissions filter, and the output of the gain flattening filter is in optical communication with the input of the second semiconductor optical amplifier.

27. The optical communications system of claim 25, further including:

an amplified spontaneous emissions filter having an input for receiving the amplified signal, and an output, wherein the input of the amplified spontaneous emissions filter is in optical communication with the output of the optical signal isolator, and the output of the spontaneous emissions filter is in optical communication with input of the second semiconductor optical amplifier.

28. The optical communications system of claim 25, further including:

a gain flattening filter having an input for receiving the amplified signal, and an output, wherein the input of the gain flattening filter is in optical communication with the output of the optical signal isolator, and the output of the gain flattening filter is in optical communication with the input of the second semiconductor optical amplifier.

29. An optical amplifier, comprising:

a first semiconductor optical amplifier having a high gain and an input for receiving an optical signal, and an output, wherein the optical signal amplified by the first semiconductor optical amplifier resulting in a first amplified optical signal having a high output power;

an optical signal isolator having an input in optical communication with the output of the first semiconductor optical amplifier, and an output, wherein the optical signal isolator receives the first amplified signal from the first semiconductor optical amplifier and transmits the first optical signal in a single direction;

an amplified spontaneous emissions filter having an input for receiving to amplified signal, and an output, wherein the input of the amplified spontaneous emissions filter is in optical communication with the output of the optical signal isolator;

a gain flattening filter having an input for receiving the amplified signal, and an output, wherein the input of the gain flattening filter is in optical communication with the output of the amplified spontaneous emissions filter, and the output of the gain flattening filter is in optical communication with the input of the second semiconductor optical amplifier; and a second semiconductor optical amplifier having a low confinement factor approximately between 1% and 2% to provide a low gain less than the first semiconductor optical amplifier, the second semiconductor optical amplifier having an input for receiving the first amplified optical signal from the gain flattening filter, and an output, wherein the amplified optical signal is amplified by the second semiconductor optical amplifier with the low gain of the second semiconductor optical amplifier and the high output power from the first semiconductor optical amplifier resulting in a twice amplified optical signal.

30. An optical amplifier, comprising:

a first semiconductor optical amplifier having a high gain and an input for receiving an optical signal, and an output, wherein the optical signal is amplified by the first semiconductor optical amplifier resulting in a first amplified optical signal having a high output power;

an optical signal isolator having an input in optical communication with the output of the first semiconductor optical amplifier, and an output, wherein the optical signal isolator receives the first amplified signal from the first semiconductor optical amplifier and transmits the first optical signal in a single direction;

an amplified spontaneous emissions filter having an input for receiving the amplified signal, and an output, wherein the input of the amplified spontaneous emissions filter is in optical communication with the output of the optical signal isolator, and the output of the spontaneous emissions filter is in optical communication with input of the second semiconductor optical amplifier; and, a second semiconductor optical amplifier having a low confinement factor approximately between 1% and 2% to provide a low gain less than the first semiconductor optical amplifier, the second semiconductor optical amplifier having an input for receiving the first amplified optical signal from the gain flattening filter, and an output, wherein the amplified optical signal is amplified by the second semiconductor optical amplifier with the low gain of the second semiconductor optical amplifier and the high output power from the first semiconductor optical amplifier resulting in a twice amplified optical signal.

31. An optical amplifier, comprising:

a first semiconductor optical amplifier having a high gain and an input for receiving an optical signal, and an output, wherein the optical signal is amplified by the first semiconductor optical amplifier resulting in a first amplified optical signal having a high output power;

an optical signal isolator having an input in optical communication with the output of the first semiconductor optical amplifier, and an output wherein the optical signal isolator receives the first amplified signal from the first semiconductor optical amplifier and transmits the first optical signal in a single direction;

a gain flattening filter having an input for receiving the amplified signal, and an output, wherein the input of the gain flattening filter is in optical communication with the output of the optical signal isolator, and the output of the gain flattening filter is in optical communication with the input of the second semiconductor optical amplifier; and a second semiconductor optical amplifier having a low confinement factor approximately between 1% and 2% to provide a low gain less than the first semiconductor optical amplifier, the second semiconductor optical amplifier having an input for receiving the first amplified optical signal from the optical signal isolator, and an output, wherein the amplified optical signal is amplified by the second semiconductor optical amplifier with the low gain of the second semiconductor optical amplifier and the high output power from the first semiconductor optical amplifier resulting in a twice amplified optical signal.

* * * * *